United States Patent [19]

Waldhauer

[11] Patent Number: 5,488,668

[45] Date of Patent: Jan. 30, 1996

[54] MULTIBAND PROGRAMMABLE COMPRESSION SYSTEM

[75] Inventor: Fred Waldhauer, La Honda, Calif.

[73] Assignee: ReSound Corporation, Redwood City, Calif.

[21] Appl. No.: 156,425

[22] Filed: Nov. 23, 1993

Related U.S. Application Data

[62] Division of Ser. No. 723,233, Jun. 28, 1991, Pat. No. 5,278,912.

[51] Int. Cl.⁶ .................................................. H04R 25/00
[52] U.S. Cl. ..................... 381/68.4; 381/106; 381/107; 381/68.2
[58] Field of Search ................................. 381/68.2, 68.4, 381/106, 107, 103; 333/14

[56] References Cited

U.S. PATENT DOCUMENTS 3,631,365  12/1971  Dolby .
3,846,719  11/1974  Dolby ...................................... 333/14

FOREIGN PATENT DOCUMENTS

2111356  6/1983  United Kingdom .

Primary Examiner—Curtis Kuntz
Assistant Examiner—Ping W. Lee
Attorney, Agent, or Firm—Burns, Doane, Swecker & Mathis

[57] ABSTRACT

An improved audio compressor of the type which is used in a hearing aid and having a programmable compression ratio is disclosed. In the preferred embodiment, the compressor includes a variable gain limiter which provides variable gain amplification of the input signal and as a further function of a programmable control signal. A feedforward circuit is disposed in parallel to the variable gain limiter and provides a fixed gain signal. The output of the limiter and the feedforward circuit are combined at a summing node, which serves as an output. The gain curve of the compressor defines a sigmoid function having a pivot midway between the upper and lower break points.

3 Claims, 10 Drawing Sheets

MULTIBAND PROGRAMMABLE COMPRESSION SYSTEM

PRIOR APPLICATION

This application is a division of Ser. No. 07/723,233, filed on Jun. 28, 1991, now U.S. Pat. No. 5,278,912.

FIELD OF THE INVENTION

This invention relates to audio signal processing and specifically to an integrated circuit multiband compressor system for use in devices for improving the hearing of the hearing impaired.

BACKGROUND OF THE INVENTION

Audio compressors are well known devices that may be advantageously employed in devices for assisting the hearing impaired. In a compressor, the gain of the device varies as a function of the amplitude of the input signal, the gain being greatest for a low level input signal and smallest for a large amplitude signal.

In many cases the response of the ear of a hearing impaired person will be substantially different in terms of sensitivity and frequency response from that of a normal person. For a person with what is termed sensorineural hearing impairment, soft sounds are rendered inaudible, while loud sounds may be subjectively just as loud as for a normal person. Conversational levels may be very soft or even inaudible for a person with sensorineural hearing impairment. Consequently, if linear amplification is used to assist such a person, loudness relationships are perceived as distorted, and loud sounds may be rendered uncomfortably and, in some cases, painfully loud. What is necessary for comprehension of speech by the hearing impaired is to raise the amplitude of soft speech cues to the level of audibility. Beyond this, further improvements may be had by reestablishing loudness relationships. These concepts may be further understood by referring to Edgar Villchur, "Signal processing to improve speech intelligibility in perceptive deafness," *Journal of the Acoustical Society of America*, Vol. 53, pp. 1646–1657.

Studies have shown that hearing aids with audio compression provide improved syllabic comprehension for persons with sensorineural hearing losses. The use of audio compressors for the hearing impaired is described extensively in a report written by Walker and Dillon, entitled "Compression in Hearing Aids: An Analysis, A Review, and Some Recommendations", NAL Report No. 90, published by the Australian Commonwealth Department of Health, National Acoustics Laboratories, June 1982. Another clinical study, recently completed by B. C. J. Moore, J. S. Johnson, T. C. Clark, and V. Pluvinage is reported in a paper, "Evaluation of a dual channel full dynamic range system for people with sensorineural hearing loss," to be published in the *Journal of the Acoustical Society of America*. This paper is conclusive on the benefits of audio multiband compression.

Audio compressors may also be advantageously employed to tailor the characteristics of a hearing aid device to compensate for unique deficiencies of individual users as well as to simulate normal hearing under a variety of situations such as quiet or noisy environments. For example, in many cases a hearing impaired person will only experience a hearing loss at high frequencies and at low levels. For such a person it is desirable to provide a device which amplifies sound only at low levels and high frequencies. At high levels and high frequencies, the gain of the device is reduced typically to a value close to unity. At low frequencies, the gain may be held near unity for all input sound levels. Thus, for this case, compression is introduced at high frequencies only, and the gain is near unity at high sound levels throughout the audio spectrum.

Since each hearing impaired person has a unique hearing response, a compression system with adjustable compression ratio and frequency response is highly desirable. A multiband compressor system of wide dynamic range is described in U.S. Pat. No. 4,882,762 titled "Multi-Band Programmable Compression System", issued Nov. 21, 1989, to the present applicant. This patent (the disclosure of which is hereby incorporated by reference), describes a system, currently in manufacture, for improving the hearing of patients with sensorineural hearing impairment. The system consists of an input transducer to convert ambient acoustic signals to electrical signals, electronic amplifier stages to establish appropriate signal levels at various points in the system, a multiband compressor, and an output transducer to convert the amplified electrical signals back into acoustic or mechanical form which can be heard by the hearing impaired person.

The multiband compressor uses a plurality of compressor circuits of the type described in U.S. Pat. No. 4,882,761, "A Low Voltage Programmable Compressor," issued Nov. 28, 1989, also to present applicant. The compressor circuits shown in the '761 patent, (the disclosure of which is also hereby incorporated by reference), each perform effectively three functions in their respective frequency bands: first, each circuit acts as a compressor circuit with programmable compression ratio; second, each provides an amount of gain that is programmable to allow tailoring to the individual user; and third, each provides the user volume control function. For purposes of this discussion, the term compression ratio is the ratio of a change in input signal level to the resulting change in output level.

The wide range of gains that must be provided by the compressor circuits in performing these three functions has been found to adversely affect their performance, particularly as compressors, as described below.

In view of the extremely small size required of hearing device circuits which must fit in the human ear, the design concept of the device shown in the '761 patent was to incorporate these multiple functions in a single circuit. The improved compressor circuit described herein removes this limitation by separating these functions into separate circuits, thereby greatly improving performance quality, reducing distortion, increasing flexibility of gain, simplifying programmability and increasing manufacturing yields, while taking no more silicon area on an integrated circuit "chip" than the earlier design.

To appreciate how the circuit performs its function, we first describe the workings of a limiter having programmable characteristics as required in the present invention and how such a limiter is used in a compressor having a programmable compression ratio.

In order to provide signal limiting, a variable gain circuit controllable by an electrical signal is required. Such circuits are well known in the art; one circuit that is particularly adaptable to the low supply voltages used in hearing aids is described in U.S. Pat. No. 4,868,517, Variolosser, issued Sep. 19, 1989 to the present applicant and Baez. As described in the '517 patent (the disclosure of which is hereby incorporated by reference), the current gain of the variolosser is equal to the ratio of two control currents, designated as $I_A$ and $I_B$, with the overall current gain equal to $I_B/I_A$. If we rectify and filter the incoming signal to this circuit to provide an envelope signal, and use this envelope signal to increase $I_A$ as the input signal increases, the current gain will decrease as the input signal increases. Hence, the slope of a curve of the output level vs input level begins to diminish at higher levels, until the output level tends to remain constant above a given input level.

The gain falls as the input level increases because $I_A$, in the ratio $I_B/I_A$, increases with input level. $I_A$ has two components, a fixed dc current and a signal dependent current. At very low sound levels, the fixed dc component of $I_A$ predominates so that the gain is constant there. It is only when the signal dependent part of $I_A$ becomes significant in relation to the dc part that the gain begins to fall. We define $P_{lb}$, the lower break point, as the sound level at which the signal dependent part of $I_A$ becomes equal to the dc part. Note that so far we have described what may be referred to as a "soft limiter", i.e., a limiter in which the gain changes gradually as the input signal increases. In this soft limiter $I_B$ is a fixed or DC current. From our definition of the lower break point, it can be seen that the response at the break point is 6 dB below the intersection of the asymptotic values of the curve as the input level goes to zero. This follows from the fact that at the break point $I_{A0}=I_{As}$ and $I_A=I_{A0}+I_{As}$, where $I_{A0}$ is the dc or constant component of $I_A$, and $I_{As}$ is the signal related component of $I_A$. Thus, at the break point $I_A=2I_{A0}$, i.e., the overall gain is reduced by 50% or 6 dB.

In the programmable compressor of the above mentioned '761 patent, the limiting action causes the slope of the output level vs input level at higher levels to begin to diminish as the value of $I_A$ rises above its dc value as described above. However, in the '761 device at some higher input level the value of $I_B$ is caused to rise above its dc value under the influence of the input signal. This introduces a second, upward break point into the curve that we term $P_{ub}$, the upper break point. At higher levels beyond $P_{ub}$ the slope of the output level vs input level begins to asymptotically approach a linear value. The mathematical function that defines these characteristics, i.e., a sigmoid function, tends to be almost linear in the region between the lower and upper break points, with a point of inflection midway between these break points, as described below. The input level corresponding to this inflection point will be termed $P_V$, the pivot point. By varying the distance between the upper and lower break points, $P_{lb}$ and $P_{ub}$, we can vary the slope of the output-input curve between the break points over a relatively wide range of audio input amplitude. It can be shown that the reciprocal of the slope of the input-output curve is the compression ratio, $\mu$. Thus, by varying $P_{ub}$ relative to $P_{lb}$ (or vice versa), it is possible to obtain a continuous variation of the compression ratio. Programming the compression ratio can therefore be accomplished by variation of one or both of these break points, which, it will be remembered, are set by dc currents applied to the aforementioned variolosser.

The prior art variable compressor applied the rectified envelope signal to change both $I_A$ and $I_B$, whereas in accordance with the present invention, $I_A$ provides the limiting action, while $I_B$ provides for programming the circuit to provide a desired compression ratio. This improvement has several other advantages that will be discussed below.

In addition to providing programmable compression ratios, the prior art circuit also allowed programming of gain, simply by varying the fixed or dc portions of $I_A$ and $I_B$, i.e., lowering $I_{A0}$ or increasing $I_{B0}$ causes the gain to increase.

Because of the wide range over which the gain of these circuits must vary in the prior art system in providing the three aforementioned functions, the values of control currents $I_A$ and $I_B$ must vary over a fairly wide range. This was found to lead to intermodulation between the control signals and spurious dc offset voltages leading to distortions, discussed below, that became quite severe for some gain or compression programmed values when the circuits were not exactly in balance. Thus, while the circuit of the '761 patent works very well to provide the desired functions, it has been found that extremely careful adjustment of the circuit parameters is required to maintain high quality signal processing. By requiring that $I_A$ and $I_B$ vary over a range wide enough to fulfill the demands of different amounts of hearing impairment, exacting specifications are placed on the integrated circuit processing to obtain high quality sound. These exacting specifications increase the manufacturing expense and reduce the manufacturing yield.

SUMMARY OF THE INVENTION

Briefly stated, the present invention provides an improved multiband compressor system that is capable of improved distortion performance, greater gain flexibility, higher performance quality, and greater ease of manufacture. The present invention also provides an improved signal processing system when compared with the prior art. The invention contemplates a hearing device that includes a microphone for converting sounds to an electrical signal and a preamplifier to amplify these signals. The preamplifier feeds the input of a multiband compressor system having an output that feeds further signal processing circuits that may include an equalizer and an output amplifier that, in turn, feeds an electroacoustic transducer, or loudspeaker. Signals from the preamplifier are fed to a band split filter having a plurality of outputs, one for each band. The outputs of the band split filter feed a plurality of signal limiters whose outputs are summed to form the output of the multiband compressor system.

In one aspect of the invention, the output of each band of the band split filter is fed not only to a limiter, but also to a resistor. The output of each limiter is summed with the signal from the resistor that is a replica of the limiter input signal. In this way, the output of each band can be separately adjusted.

In an alternate arrangement, a signal from the input of the band split filter is summed with the limiter outputs to create a multiband compression system wherein the compression ratio of each band is separately controllable by controlling the gain of each limiter.

In still another aspect of the invention, one or more limiters may be left out for frequencies where limiting is not needed. In many cases of hearing impairment, for example, compression is not needed at the lowest frequencies, so that a simple resistor may form the sole path from the lowest band output of the band split filter to the output summation point.

In the preferred embodiment each of the compressors comprises two variolossers connected in series. The first is used as a limiter for signal compression with a programmable compression ratio. The compression ratio of the first variolosser can be varied using a single programmable variable. The second variolosser provides a variable (audiologically programmed) gain, a gain trim, and user volume control. Thus, in addition to providing programmable compression ratios, this circuit also allows programming of gain.

Moreover, the circuit provides independent programming of gains at high signal levels, such as at 80 dBSPL, and at low levels such as 50 dBSPL. (The units generally used to measure acoustic amplitude are decibels of sound pressure level or "dBSPL", and this term will be used herein.) The circuit further provides a dc control of gain from an independent source, allowing user control of the volume.

Accordingly, it is an object of this invention to provide an improved multiband programmable audio compression system.

It is another object of the present invention to provide an improved multiband programmable compression system wherein gain and compression ratio in each respective frequency band may be adjusted independently.

It is also an object of the present invention to provide a signal compressor for hearing instruments having a programmable compression ratio with superior distortion characteristics.

It is still another object of this invention to provide high quality signal processing with less exacting circuit specifications, thereby to increase manufacturing yields.

It is a further object of this invention to provide a programmable signal compression system whose compression ratio can be varied with a single program variable.

It is a further object of this invention to provide a multiband compression system whose equalization characteristic varies with signal level.

It is a yet another object of this invention to provide a compressor with a continuously variable compression ratio that is easily manufactured in integrated circuit form.

It is a further object of this invention to provide a compressor with a continuously variable compression ratio that is operable from a single energy cell.

BRIEF DESCRIPTION OF THE DRAWINGS

These and other objects of the present invention may be fully understood through the description below and the accompanying drawing in which.

DETAILED DESCRIPTION OF THE INVENTION

A signal compressor system comprises a variable gain circuit with a control circuit responsive to the amplitude of the signal at some point in the system. The circuit varies the gain of the system based on a desired relationship between the input and output signal levels over a range of input signal amplitudes. In the case of the present invention, the variable gain circuit or variolosser is a current multiplier whose transfer function is linear. In order to provide signal limiting, a variable gain circuit controllable by an electrical signal is required. Such circuits are well known in the art; one circuit that is particularly adaptable to the low supply voltages used in hearing aids is described in the aforementioned '517 patent.

As described in the '517 patent, the current gain of the variolosser circuit is equal to the ratio of two control currents designated $I_A$ and $I_B$, with the current gain equal to $I_B/I_A$. The control circuits of the present invention are adapted to programmably control a plurality of variolossers of the type described in the '517 patent to provide a desired gain, compression ratio, and signal level-dependent frequency response which may be adaptively modified for the needs of individual users.

Figure 1:
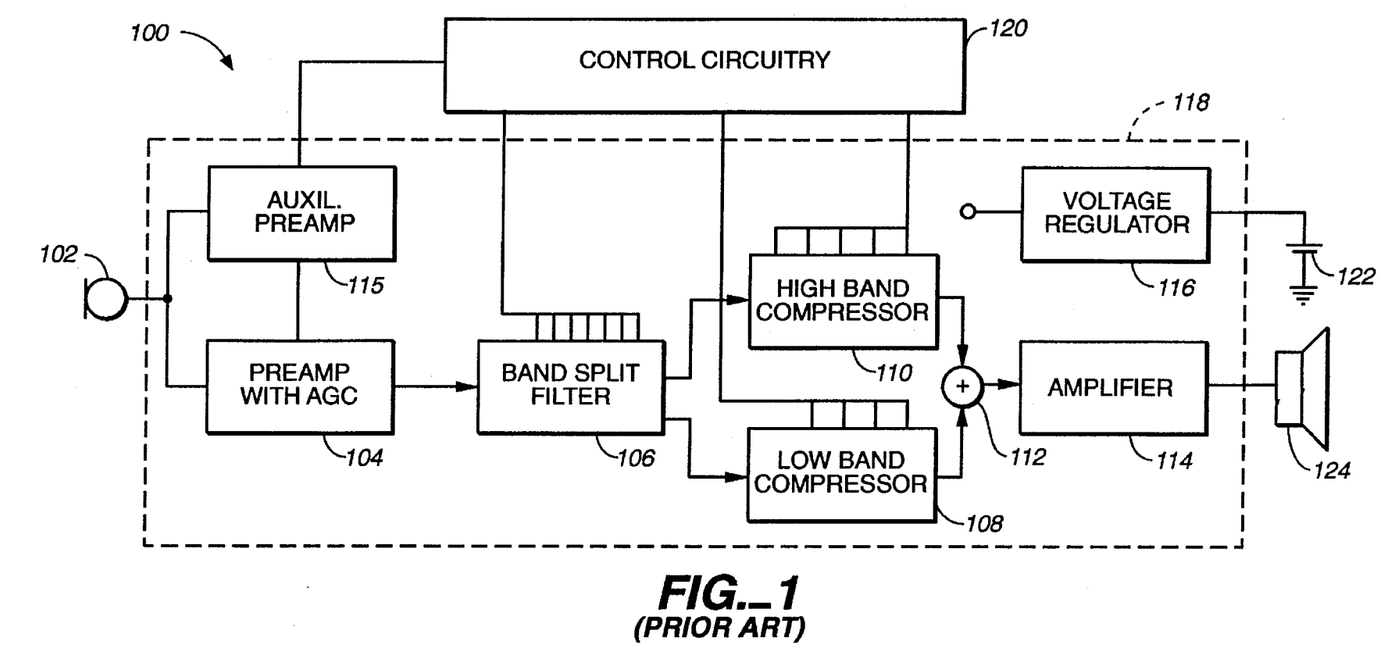
FIG. 1 is a block diagram of a multiband compressor of the type which is known in the prior art.

One example of a prior art signal compressor system is shown in FIG. 1. This system is described in the above mentioned '762 patent. Referring now to FIG. 1, the programmable multiband compressor system 100 receives an audio signal with microphone 102. The output of microphone 102 is coupled to a preamplifier and automatic gain control circuit (AGC) 104 and auxiliary preamplifier 115 which controls the AGC action. The output of the AGC circuit 104 is coupled to programmable bandsplit filter 106 which separates the audio signal into a plurality of frequency bands which, in the preferred embodiment, consist of a high and a low frequency band. The low frequency band output of programmable bandsplit filter 106 is coupled to programmable low band compressor 108 and the high frequency band output of programmable band split filter 106 is coupled to high band programmable compressor 110. The output signals of the low band compressor 108 and the high band compressor 110 are coupled to summing circuit 112, which combines these output signals to produce a complete audio signal. The output of the summing circuit 112 is coupled to amplifier 114, which amplifies the composite audio signal to a level sufficient to drive an annunciator 124 which is coupled to amplifier 114. The system 100 further includes voltage regulator 116 for supplying a regulated voltage to various circuits of the system 100. Such a prior art programmable multiband compressor system is particularly adapted for implementation on an integrated circuit, and all of the circuits enclosed in the area 118 may be constructed on a single integrated circuit substrate. The programmable multiband compressor system 100 shown in FIG. 1 is adapted to be powered by a single cell, low voltage battery 122.

The programmable multiband compressor system 100 is adapted to receive a plurality of control signals which may be generated by an external control circuit 120. The control circuit 120 is coupled to bandsplit filter 106 and to the low and high band compressors 108 and 110, respectively. The control signals generated by control circuit 120 control the frequency split between the low and the high frequency bands as well as the gain and compression ratios of the low and high band compressors 108 and 110 to generate a desired response for the system 100 to compensate for a large variety of hearing impairments.

In the prior art system described, each of the compressors 108, 110 may be circuits of the type described in the '761 patent.

Figure 2A:
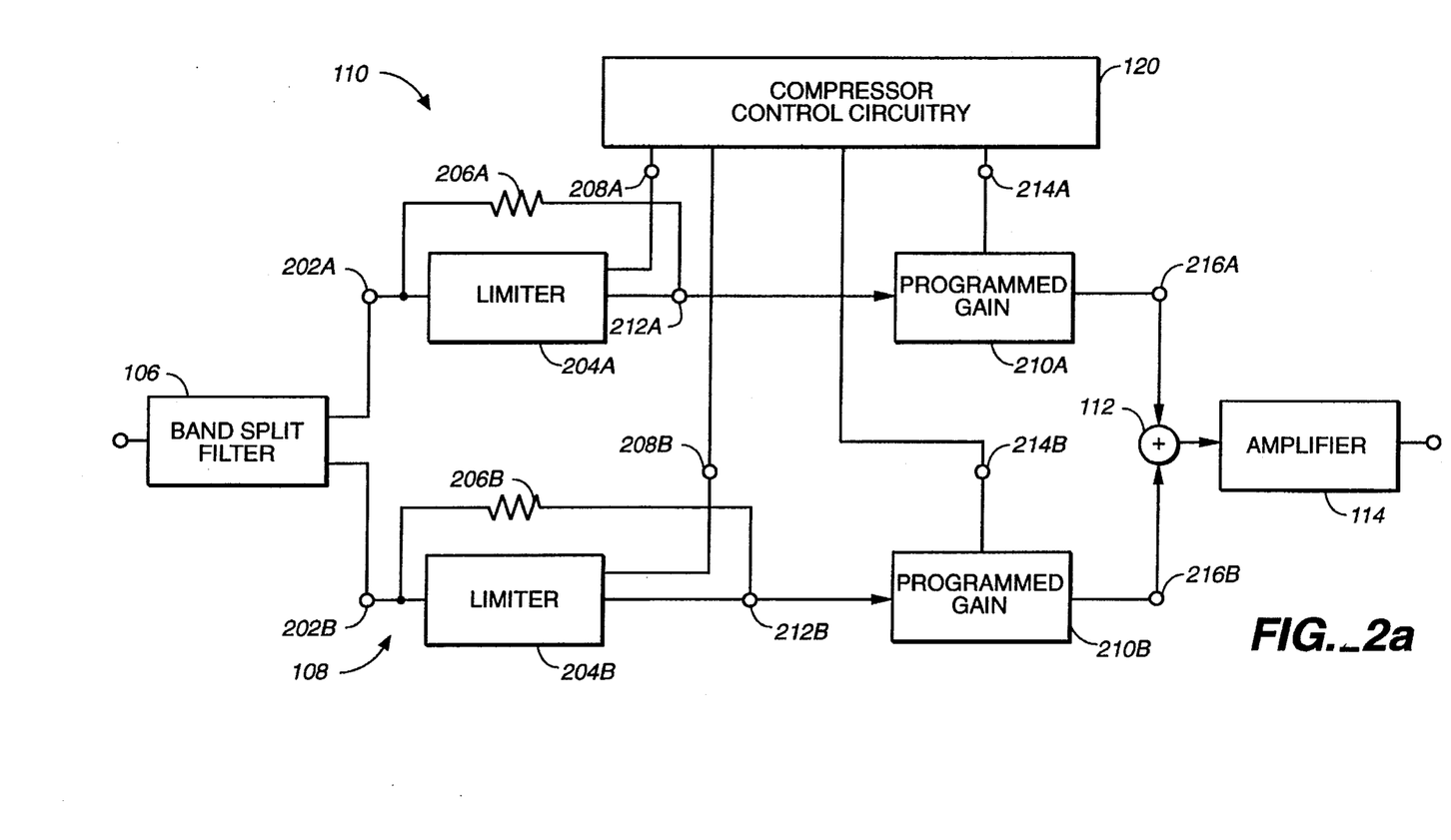
FIG. 2a is a simplified block diagram and FIG. 2b is a more detailed block diagram of the compressor in accordance with one aspect of the present invention.

A pair of compressor systems in accordance with the present invention and suitable for use as the compressors 108 and 110 in the overall system of FIG. 1 are shown in block form in FIG. 2a. Signals from the high band output of the above described band split filter 106 are applied to input terminal 202A of high band compressor system 110, and signals from the low band output of band split filter 106 are applied to input terminal 202B of low band compressor system 108. Both compressors systems 108 and 110 operate in the same fashion; the following description made in reference to high band compressor 110 applies equally to low band compressor 108.

The signal is applied to both a signal limiter 204A, to be described below, and a feedforward resistor 206A. Currents flowing from the output of limiter 204A and from feedforward resistor 206A are added together at the summing node 212A and applied to the programmable gain section 210A. A control current is applied to compressor programming terminal 208A from control circuitry 120 to programmably vary the compression ratio of the compressor system. Output from gain section 210A is delivered to output terminal 216A. The gain of the programmable gain section 210A can be varied by applying a current from control circuitry 120 to programming or control terminal 214A. Signals from output terminals 216A and 216B are summed and applied to amplifier 114.

Figure 2B:
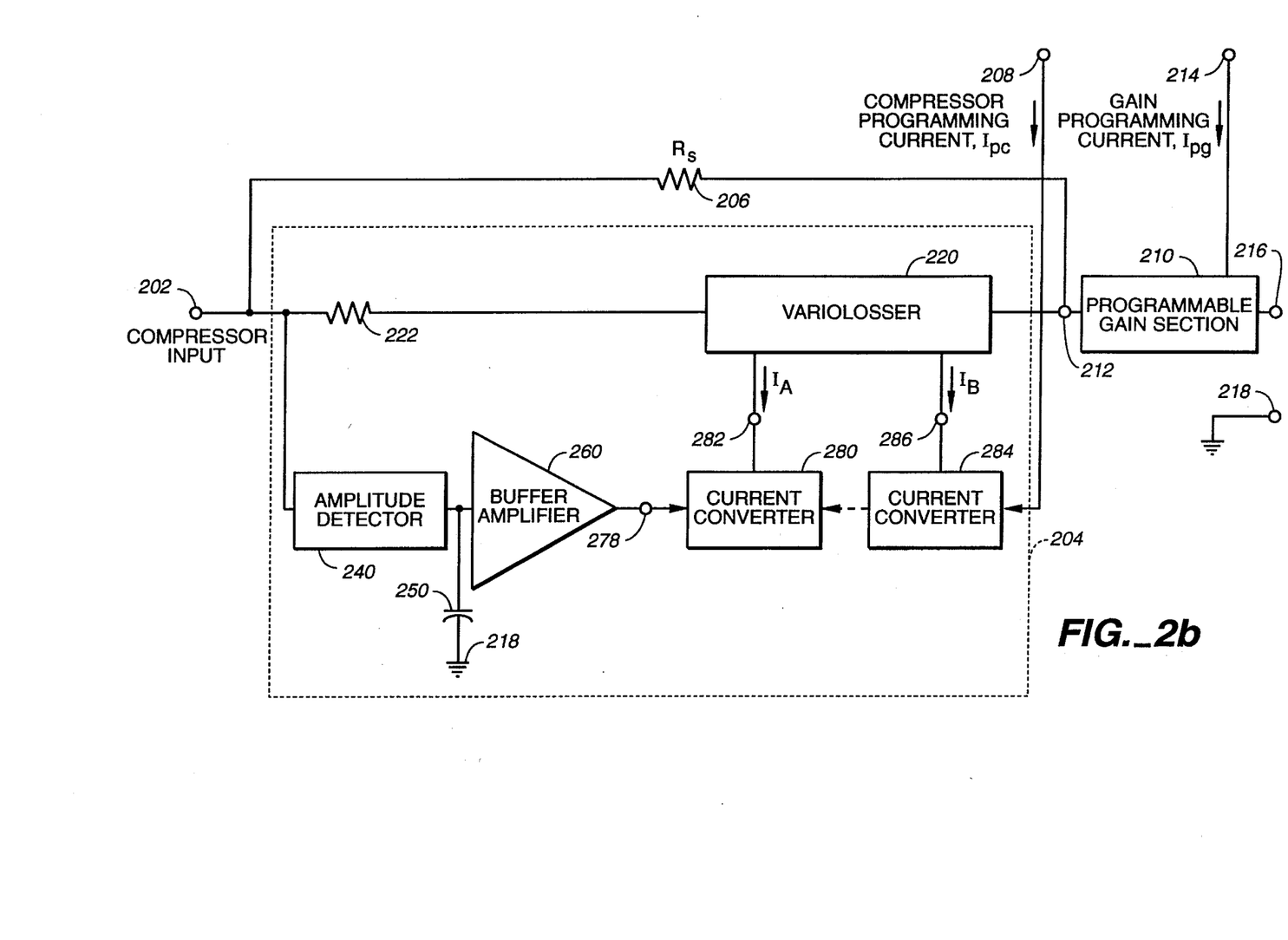

A limiter suitable for use in the present invention is depicted in further detail in FIG. 2b, in which the input voltage signal on input terminal 202 generates a current in input resistor 222, which current is applied to variolosser 220. Variolosser 220 includes two control terminals, 282 and 286, which are used to control the gain of the variolosser. The output of the variolosser is connected to a summing node 212 at the input of programmable gain section 210. Input voltage from terminal 202 also generates a current in feedforward resistor 206, which current is also applied to summing node 212.

Input voltage on terminal 202 is also applied to an amplitude detector 240 which rectifies the incoming signal. The output of amplitude detector 240 is connected to a capacitor 250 which filters the rectified signal. The other side of the capacitor is connected to a point of reference potential, 218. The rectified, filtered signal is applied to a buffer amplifier 260. Thus, amplitude detector 240 detects the peak amplitude voltage of the input signal and delivers it to capacitor 250, which holds this voltage for a predetermined time. The holding or "release" time of the circuit is generally set between 10 and 100 ms. Voltage on capacitor 250 forms the input to buffer amplifier 260, whose output is applied to current converter 280 and used to vary the current of the first control terminal 282 of variolosser 220. A compressor programming current $I_{pc}$, applied to compressor programming terminal 208, is converted to a control current in current converter 284 and applied to a second variolosser control terminal 286.

The control currents applied to variolosser control terminals 282 and 286 control the current gain of the variolosser; the gain of the variolosser is equal to the ratio $I_B/I_A$, where $I_B$ is the current applied to the second control terminal 286 and $I_A$ is the current applied to the first variolosser control terminal 282. The value of $I_{A0}$ is set by a combination of a dc output level from buffer amplifier 260 and by the programming current $I_{pc}$, which is also used to control the dc value of $I_B$.

In the signal processing arrangement just described the input signal is rectified and filtered to provide an envelope signal, and this envelope signal is used to increase $I_A$ as the signal increases. Thus, the current gain will decrease as the input signal increases, and the output level will tend to remain constant above a given input signal level. This action is illustrated in FIG. 3, to which reference is now made.

Figure 3A:
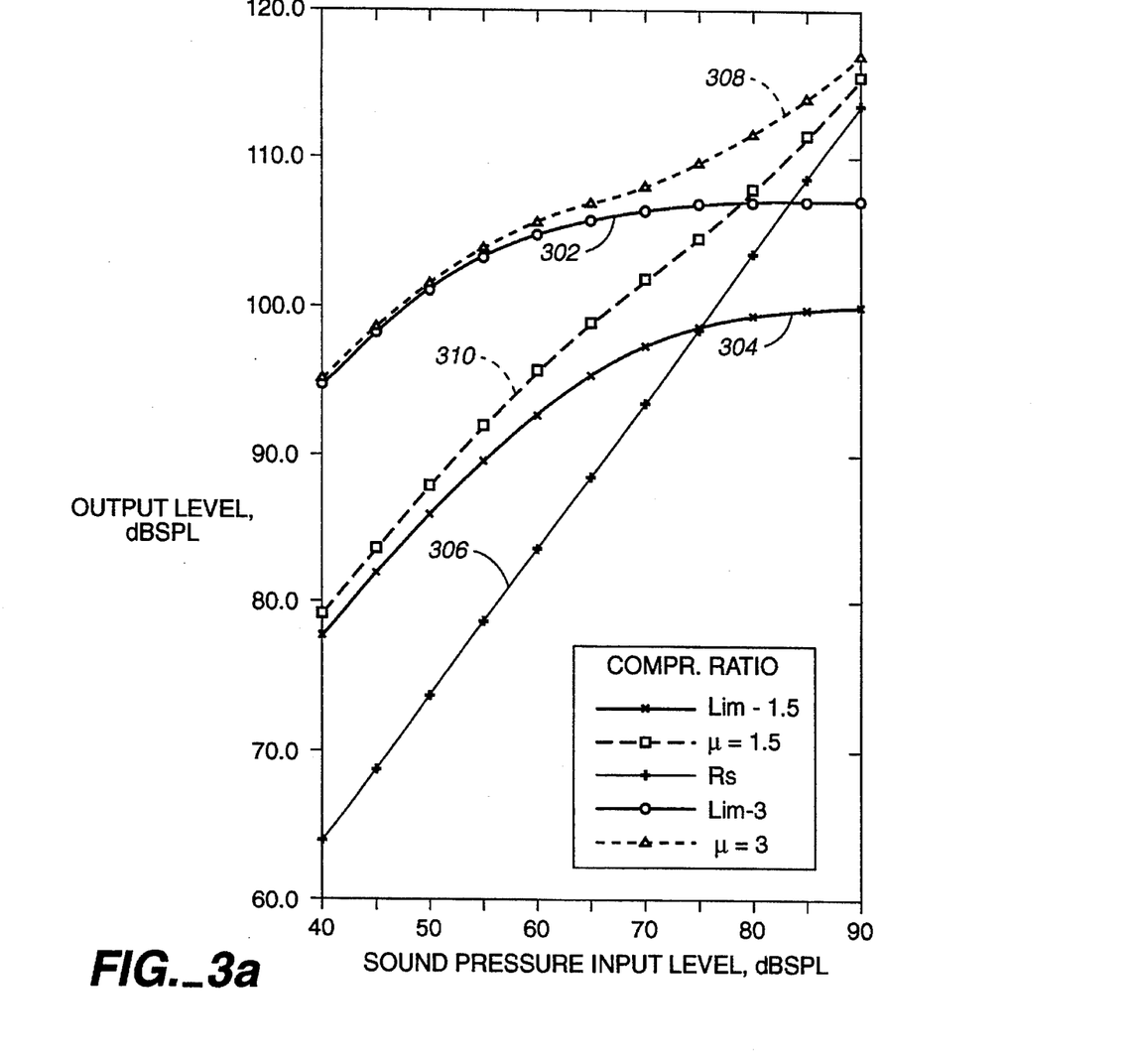
FIG. 3a and 3b are graphs of the output response and gain of limiter circuits of the present invention.

FIG. 3a shows graphs of output level vs input level. Naturally, input and output transducers are required to convert acoustic signals to electrical signals and vice versa, as well as other electronic amplifier stages that provide appropriate signal levels to the above mentioned limiter and to the output electroacoustic transducer, or loudspeaker, as described with reference to the prior art circuit of FIG. 1. In the graph of FIG. 3a the output of limiter 204 is shown by curve 302 for one value of control current from control circuitry 120, and by curve 304 for a second value of control current. Each of these curves exhibits a slope of unity at extremely low levels, and a slope of zero at extremely high levels. The graph for signals through feedforward resistor 206 is shown by the straight line 306 which is seen to exhibit a unit positive slope since the output is directly proportional to the input. The sum of the resistor signal 306 and the limiter signal under the first mentioned condition 302 is shown by dashed line 308, and that for the second condition 304 by dashed line 310. Note, the two limiter curves 302 and 304, are identical in shape but translated in both vertical and horizontal directions in a manner described below. It is clear that the two dashed line curves 308 and 310, depicting the sums of signals for the two signal paths, exhibit differing slopes and only relatively minor departures from linearity. The slopes of these two curves are the reciprocals of the compression ratios in the two cases depicted, showing the control of compression ratio afforded by the control circuitry 120 in accordance with the invention.

Figure 3B:
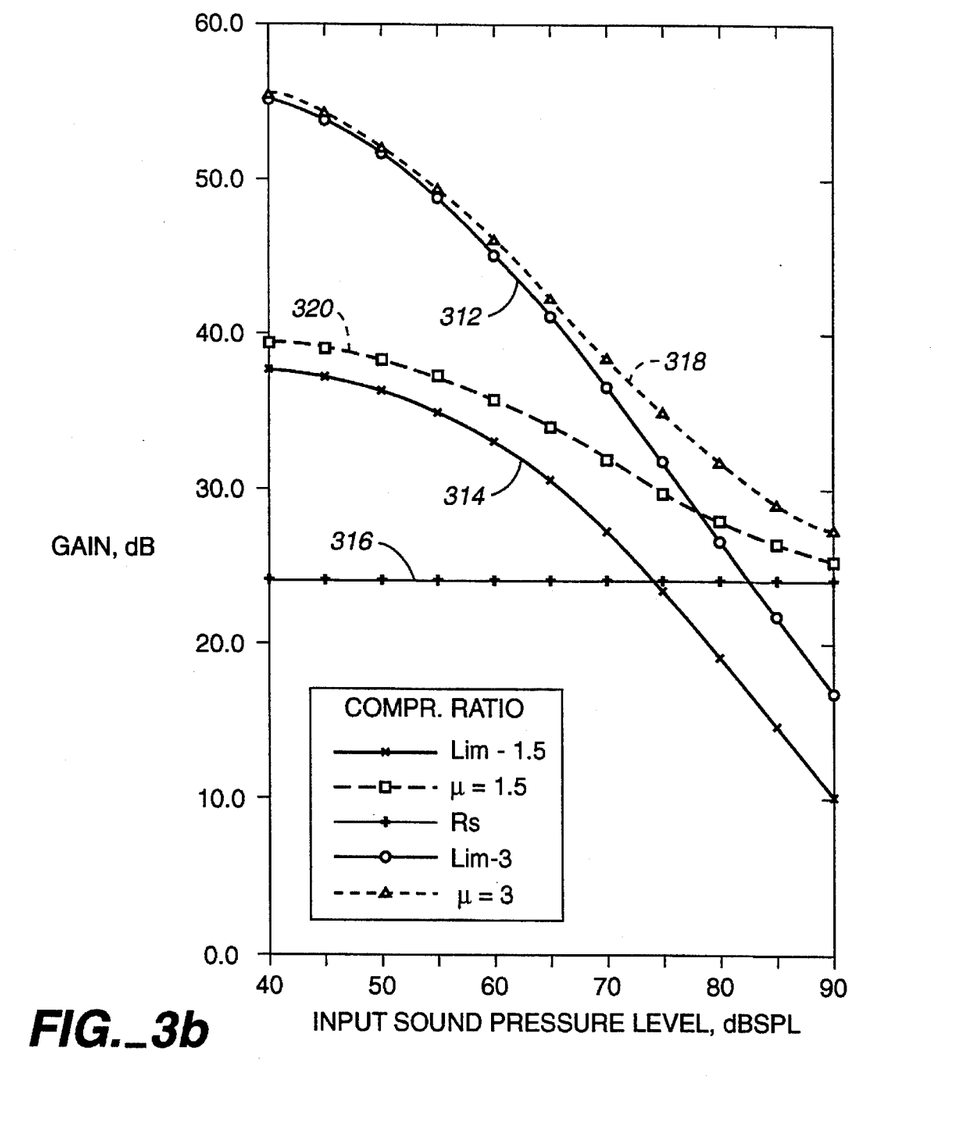

In FIG. 3b, the same information is presented, this time as a plot of gain vs input level. Solid line curves 312 and 314 correspond to the conditions of curves 302 and 304 of FIG. 3a, respectively. The limiter gain is relatively constant at extremely low levels, and approaches −1 asymptotically at high levels. The feedforward resistor gain 316 is, of course, constant over the whole range. Dashed line curves 318 and 320 follow the combined gain of the limiter and the feedforward resistor 206 and correspond to curves 308 and 310 of FIG. 3a. For the limiter, the gain falls as the input level increases because $I_A$, in the ratio $I_B/I_A$ increases with input level. In the region of very low levels, the constant component of $I_A$, which is a fixed dc value, predominates so that the gain is relatively constant at low sound levels. As noted above, it is only when the signal dependent part of $I_A$ becomes a significant portion of the dc part that the gain begins to fall. We have defined $P_{lb}$, the lower break point, as the sound pressure level at which the signal dependent part of $I_A$ becomes equal to the dc part. Note that for the limiter of the present invention, $I_B$ is a dc or fixed current which is set by the programming current $I_{pc}$.

In the programmable compressor described in above mentioned '761 patent, the value of $I_A$ rises with input signal as in the present invention. However, in the circuit shown in the '761 patent the value of $I_B$ also rises above its dc value at some higher input level. The variable nature of $I_B$ is used to introduce a second break point into the gain curve that we have termed $P_{ub}$, the upper break point. When this second break point is introduced, the slope of the output level vs input level at higher levels begins to rise. Thus, the overall gain curve is a sigmoid function. It is known that such functions do not follow the asymptotes very closely. Rather, they tend to be almost linear in the region between the lower and upper break points, with a point of inflection midway between these break points.

By varying the distance between the lower and upper break points, $P_{lb}$ and $P_{ub}$, we can vary the slope of the compressor curves (i.e., dashed line curves 308, 310) of FIG. 3a over a relatively wide range in dBSPL. As noted above, the reciprocal of the slope of the input-output curve is termed the compression ratio, $\mu$. Thus, by varying $P_{ub}$ relative to $P_{lb}$ we obtain a continuous variation of the compression ratio. Programming the compression ratio can therefore be accomplished by variation of one or both of these break points, which are controlled by dc currents applied to the aforementioned variolosser. The prior art variable compressor applied the rectified envelope signal to change $I_B$ in order to provide an upper break point and thereby set the compression ratio.

In the compressor of the present invention, a simpler method is employed to provide the upper break point and thereby effect the variation of compression ratio. In this circuit the drop in gain is initiated as in the earlier method, by increasing the value of $I_A$, which increases the negative feedback around the variolosser amplifier. The means by which the drop in gain is terminated at the end of the compression span, however, is not by increasing the forward gain by increasing $I_B$ as in the prior art device, but rather by sending signals through a feedforward signal path, which may be a simple resistor 206 as shown in FIG. 2. While a simple resistor is used in the preferred embodiment, it will be apparent to those skilled in the art that other fixed gain devices, such as a linear amplifier, can also be employed.

To appreciate the mathematical characteristics of the programmability of the compressors of the present invention, we now develop the sigmoid relationship for gain of the compressor. The current gain of the variolosser is given by the ratio of output to feedback tail currents. By inspection of FIG. 2b, the compression section transconductance, $g_c$ (the current output for a given voltage input $V_c$), is given by:

$$g_c = \frac{1}{R_{in}} \frac{I_{Bc}}{I_{Ac}} + \frac{1}{R_s} \quad (1)$$

The output of the compressor section therefore consists of two components; the current through feedforward resistor 206 ($R_s$), and the input current through resistor 222 ($R_{in}$), multiplied by the current gain for input voltage $V_c$ of the compressor variolosser, $I_{Bc}/I_{Ac}$. These two currents are combined at the output summing node 212, i.e., the input of the gain variolosser 210. The two terms of Eq. 1 must have the same sign since otherwise signal cancellation would take place; thus, the variolosser must not include a phase reversal when a simple feedforward resistor is used. As noted above, other feedforward devices may be used instead of resistor 206. For example, if phase reversal in the variolosser is desired, the feedforward circuit may be a simple linear amplifier which also introduces phase reversal.

Fixed resistor 206, $R_s$, gives a component of gain that does not vary with input level. The compressor variolosser has a gain that falls as the input signal rises above $P_{lb}$, the lower break point. The slope of variolosser gain vs input level approaches the value −1 at high levels, since $I_{Ac}$ rises directly with signal level. The overall level of the variolosser gain, for a given input level, depends on $I_{Bc}$. The combined gain of the two paths of Eq. 1, however, becomes flat at sufficiently high input levels as $I_{Bc}/I_{Ac}$ approaches zero. This constitutes the means by which the upper break point is set and the compression ratio is varied.

In the present invention, $I_{Bc}$ is not signal dependent but is programmable. When $I_{Bc}$ is zero, the compressor portion of the circuit is inactive, the gain is $1/R_s$, and the device is programmed for a compression ratio of 1 (i.e., no compression). As $I_{Bc}$ increases, the gain at low levels is increased, but the negative slope of gain with input level prevents the compressor from affecting high level gain as much. Thus, $I_{Bc}$ becomes the compression adjustment parameter.

Feedback tail current $I_{Ac}$ is made up of a fixed part, $I_{A0}$, and a signal dependent part, $I_{As}$, so that:

$$I_{Ac} = I_{A0} + I_{As} \quad (2)$$

Where $I_{A0}$ is the fixed part of $I_{Ac}$ that sets the lower break point for the compressor; $I_{As}$ is the signal dependent part. Using Eq. 1, we can write:

$$g_c = \frac{1}{R_s}\left(1 + \frac{R_s}{R_{in}}\left(\frac{I_{Bc}}{I_{As}+I_{A0}}\right)\right) \quad (3)$$

If we normalize the peak signal current, $I_{As}$, to the fixed current, $I_{A0}$, by defining a normalized signal variable, $v_p = I_{As}/I_{A0}$, we obtain:

$$g_c = \frac{1}{R_S}\left(\frac{v_p + 1 + \left(\frac{R_s I_{Bc}}{R_{in} I_{A0}}\right)}{(v_p + 1)}\right) \quad (4)$$

This expression, which is plotted as curves 318 and 320 in FIG. 3b, gives the gain as a ratio of a numerator with a fixed and a signal-dependent part, and a denominator having a different fixed but the same signal-dependent part. The lower break point, defined as the input level at which $v_p=1$, can be constant with compression as it is in the device of the '761 patent. As described below, the lower break point can also be varied with compression ratio to secure a better variation of gain with level over the programmable compression range.

Eq. 4 is the sigmoid relationship but it is secured more simply in the present invention than in the prior art. As can be seen by inspection of the equation, when $I_{Bc}$ is zero, the gain is not a function of $V_C$, the input signal variable.

Figure 4:
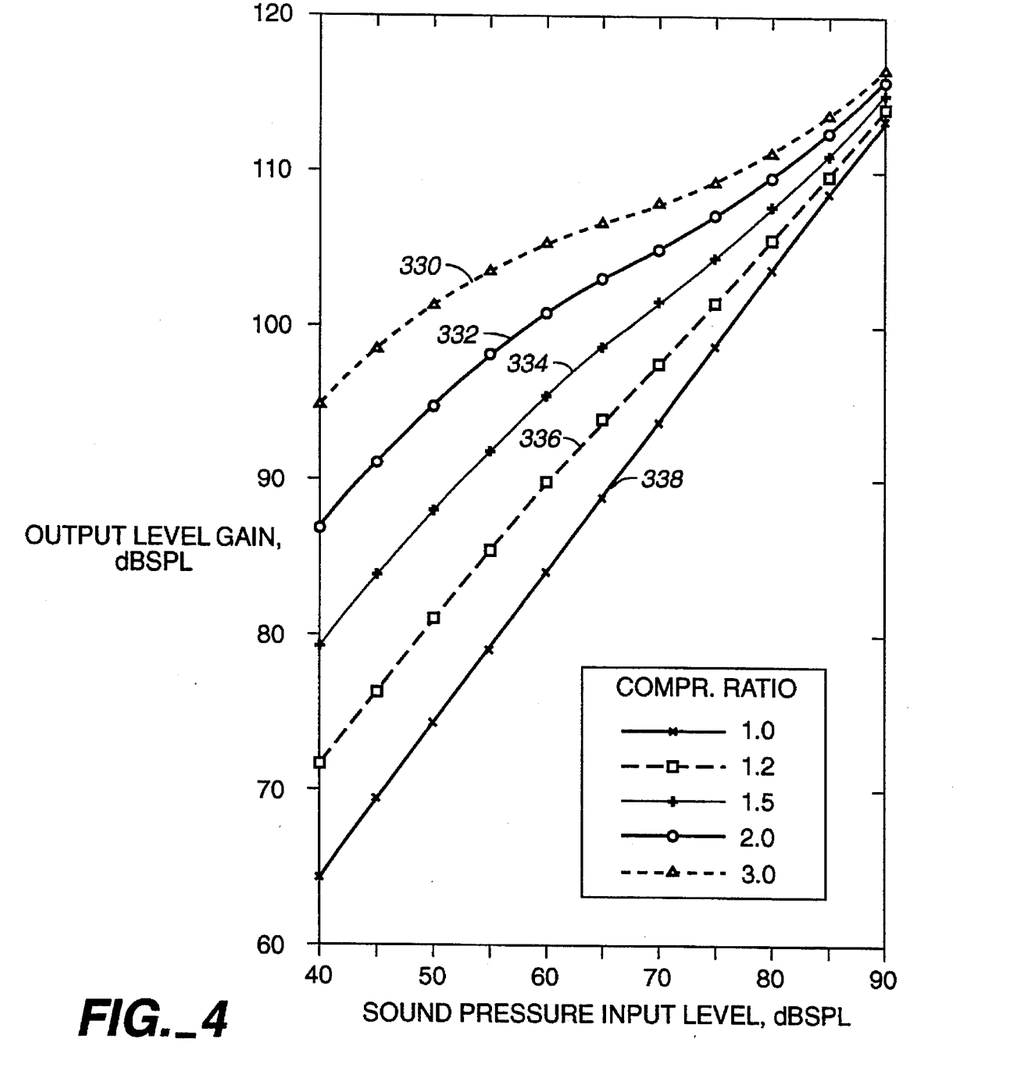
FIG. 4 is a graph of the output response of the circuit of the present invention for various programmed compression ratios showing the relatively constant or linear characteristic of the compression ratio over the dynamic range of ordinary speech, and showing the degree of slope change achievable by the circuits in accordance with the invention.

FIG. 4, to which reference is now made, is a graph showing gain curves 330, 332, 334, 336 and 338, which correspond to the output level as a function of input level for various values of compression ratio obtained for different values of programming current provided to control terminal 208 of FIG. 2. This figure shows the degree of relative linearity of the input-output curves, i.e., change in gain as a function of input level, over a relatively wide range of compression ratios obtained with the compression system of the present invention.

Figure 5:
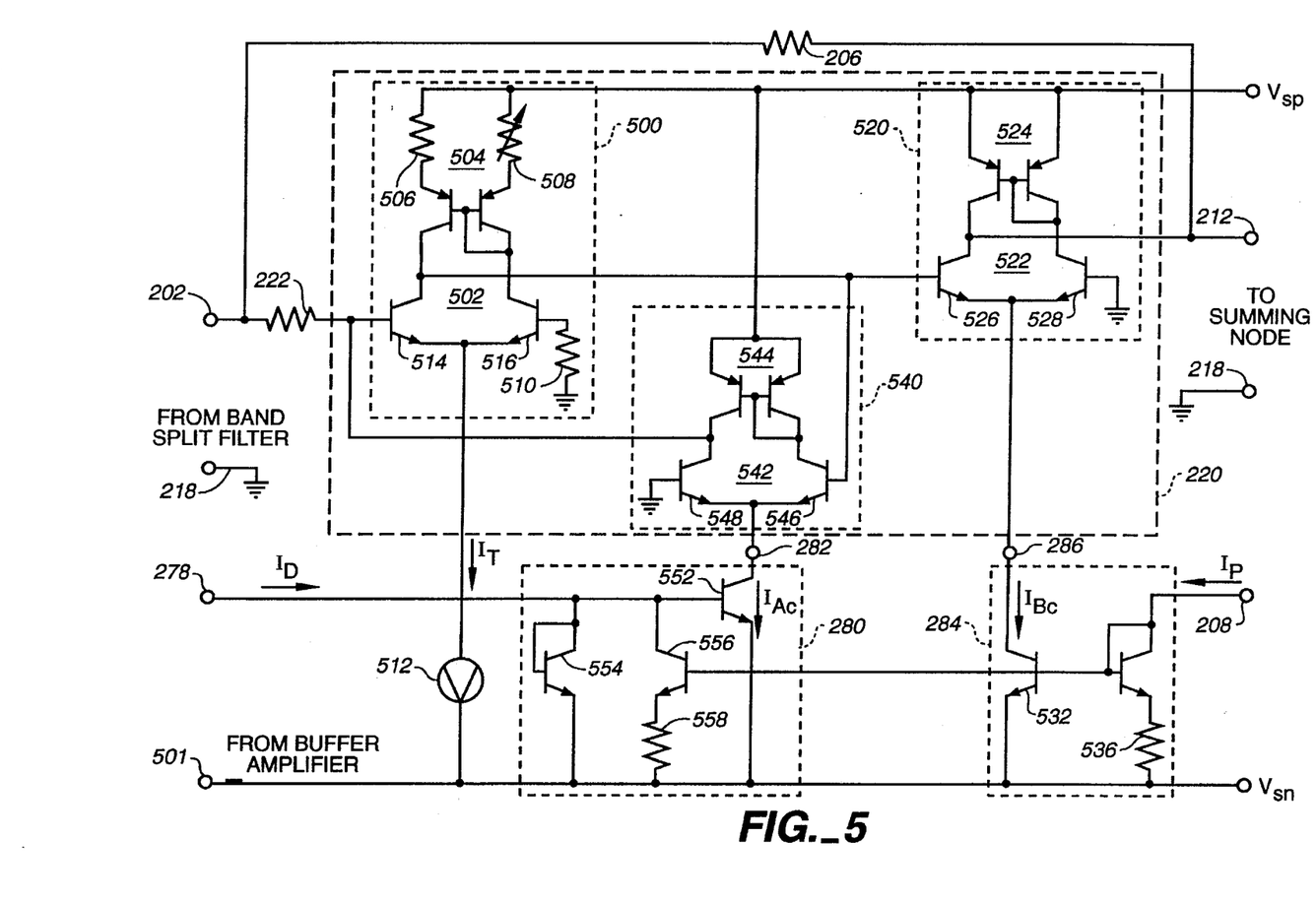
FIG. 5 is a circuit schematic diagram of a variolosser and a control circuit for a compressor of one embodiment of the invention.

FIG. 5 is a circuit schematic diagram of a variolosser and a control circuit for a compressor in one embodiment of the present invention. Signals are fed to the circuit output via feedforward resistor 206 and to variolosser 220 by input resistor 222. Variolosser 220 was described in the '517 patent. Variolosser 220 includes an amplifier, 500, an output differential cell or output cell, 520, and a feedback differential cell or feedback cell, 540. The amplifier comprises a differential pair, 502, including transistors 514 and 516 disposed with their emitters connected in common, and a current mirror load, 504, which may include dc offset adjustment or trim resistors 506 and 508. The tail current for differential pair 502 flowing from the emitters of transistors 514 and 516 is provided by a current generator, 512, provided by a transistor in a manner well known to practitioners of the art. The base of transistor 516 is returned to point of reference potential 218 through resistor 510, whose function is to balance the dc voltage drop of base current in resistor 222, by a nominally equal and opposite dc drop of base current in resistor 510.

Output cell 520 includes a differential pair 522, comprising transistors 526 and 528 disposed with their emitters coupled together, and a current mirror load, 524. The base of transistor 528 is returned to a point of reference potential 218, while the base of transistor 526 is connected to the collector of transistor 514, the output of amplifier 500. The output of output cell 520 is coupled to output terminal 212 from the collector of transistor 526. The tail current of output cell 520, $I_{Bc}$, is supplied by transistor 532, whose base is connected to diode connected transistor 534. The emitter of transistor 534 is connected through resistor 536 to the negative supply voltage. Tail current $I_{Bc}$ is thus controlled by programming current $I_{pc}$ fed into control terminal 208. Transistors 532 and 534 comprise current converter 284 that translates programming currents applied to terminal 208 to output cell control current $I_{Bc}$.

Feedback cell 540 includes a differential pair 542, comprising transistors 546 and 548, and a current mirror load 544. The base of transistor 548 is returned to a point of reference potential 218, while the base of transistor 546 is connected in common with the base of transistor 526 to the collector of transistor 514, the output of amplifier 500. The output of feedback cell 540 is coupled to the base of transistor 514 from the collector of transistor 548. Feedback cell 540 thereby provides feedback around amplifier 500 and renders the input at the base of transistor 514 a summing node. The tail current of feedback cell 540, $I_{Ac}$, is supplied by transistor 552, whose base is connected to diode connected transistor 554. Tail current $I_{Ac}$ is thus controlled by buffer amplifier output current $I_D$, fed into control terminal 278. Transistors 552 and 554 comprise current converter 280 that translates signal envelope currents derived from buffer amplifier 260 to feedback cell control current $I_{Ac}$.

Transistor 556 has its base connected to the base of diode connected transistor 534, and its emitter connected to ground through resistor 558. The collector of transistor 556 is connected to the base of transistor 552. The function of this arrangement is to subtract some current from the buffer amplifier output current, thereby lowering the value of lower break point $P_{lb}$ as the compressor programming current is increased. It is noted that the buffer amplifier output also produces a dc current in the absence of any input signal and that this sets the maximum value of $I_{A0}$. Resistor 558 allows the amount of current subtraction to be designed to tailor the lower breakpoint to a desired value as the compression is varied. Thus, the value of $I_{A0}$, i.e., the dc component of $I_{Ac}$ varies and is also set by the programming current $I_{pc}$. In the preferred embodiment, resistor 558 is selected to set the lower break point at 50 dBSPL for maximum compression, i.e., when $I_B$ is at its maximum allowable value.

In operation, the output and feedback cells, 520, 540 are identical except for their tail currents, supplied respectively from current converters 280 and 284. With the gain of amplifier 500 reasonably high, the current gain of the variolosser is equal to the ratio of the output and feedback tail currents, $I_B/I_A$. Thus, when envelope signals from the buffer amplifier are presented to current converter 280, tail current $I_A$ increases and the gain of variolosser 220 is reduced.

It is well known that the relationship between the input voltage to a differential pair and the output current therefrom is nonlinear. The relatively wide dynamic range of the variolosser 220 is ascribed to the relatively precise cancellation of nonlinearities of the output and feedback cells. Assume that a pure sinusoidal signal current appears at the output of the output cell 520. The voltage at the bases of transistors 526 and 546 (arising from some input signal) must be predistorted to produce this pure sinusoidal signal. The output current of the feedback cell must behave similarly to the output cell, and must also have a pure sinusoidal output. But the output of the feedback cell is virtually the entire input signal current to the variolosser so that the input and output are both essentially sinusoidal. Thus, in normal operation, the variolosser has very low distortion characteristics. Other distortions do arise, to be discussed below, that are involved with the operation of the variolosser as a compressor. We first turn our attention to the amplitude detector and buffer amplifier.

Figure 6:
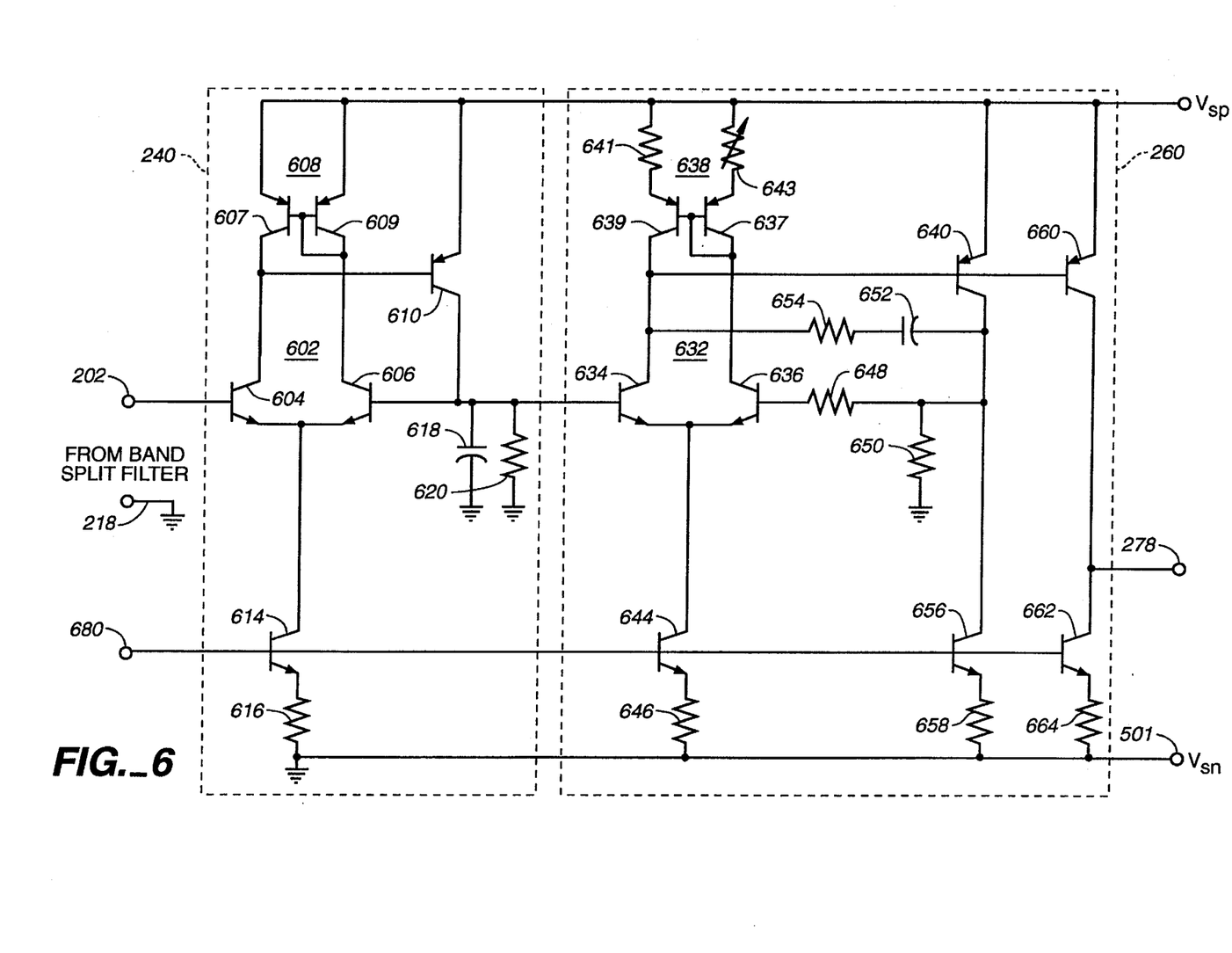
FIG. 6 is a circuit diagram of an amplitude detector and buffer amplifier for controlling the circuit of FIG. 5.

Signals from the band split filter 106 at the input 202 of the compressor system are applied to the amplitude detector 240 and buffer amplifier 260 as shown in FIG. 6, to which we now turn. The amplitude detector is shown as a half-wave rectifier, but other types of amplitude detectors, known to those skilled in the art, could also be used without departing from the spirit of the present invention.

Amplitude detector 240 generates a voltage related to the positive envelope of the audio input signal. Specifically, the amplitude detector generates a control that follows the positive peak envelope of the audio input signal. The circuit is adapted to receive an audio input signal at terminal 202. This signal is further coupled to the variolosser 220 and the feedforward resistor 206 as described above.

Amplitude detector 240 comprises a differential pair 602, including transistors 604 and 606 disposed with their emitters connected together. The collectors of transistors 604 and 606 are connected to a mirror load 608. The tail current of the differential pair is supplied by a transistor 614 whose collector is connected in common to the emitters of transistors 604 and 606. The base of transistor 614 is connected to a source of potential at terminal 680 that allows transistors connected to it to generate a predetermined current. Resistor 616 allows the adjustment of the tail current from this predetermined amount. The output of the differential pair 602, i.e., the collector of transistor 604, is coupled to the base of output transistor 610, whose emitter is connected to the positive supply and whose collector is connected to a filter capacitor 618 and a load resistor 620.

When a positive signal is received at terminal 202, transistor 604 conducts more heavily, pulling base current from transistor 610. This causes the collector current of transistor 610 to increase, thereby charging capacitor 618. The time taken to charge the capacitor is termed the attack time, and is quite rapid. In the preferred embodiment the attack time is less than one millisecond. When capacitor 618 is thus charged, and the input signal subsides, the base of transistor 606 becomes more positive than that of transistor 604, so that transistor 604 stops conducting. At the same time, diode connected transistor 609 of the mirror load conducts heavily and tries to get transistor 607 of the mirror 608 also to conduct heavily. Since there is no place for the current to flow, transistor 607 saturates, pulling the collector voltage of transistor to rise almost to the supply and cutting off transistor 610. Thus, capacitor 618 remains charged, its only discharge path being resistor 620. The voltage on capacitor 618 decays slowly, and discharges in an amount of time called the release time. In the preferred embodiment the release time is set between 10 and 100 ms. Thus, at any given time the voltage across capacitor 618 is related to the positive peak value of the input signal, also termed the positive envelope of the signal.

The envelope signal on capacitor 618 is coupled to the input of the buffer amplifier 260. The buffer amplifier 260 comprises an operational amplifier with unity feedback around it. Amplifier 260 comprises an input differential pair 632 including transistors 634 and 636 disposed with their emitters connected together. The collectors of transistors 634 and 636 are connected to a mirror load 638. The tail current of the differential pair is supplied by a transistor 644 whose collector is connected in common to the emitters of transistors 634 and 636. The base of transistor 644 is connected to bias line 680 that allows transistors connected to it to generate a predetermined current. Resistor 646 allows the adjustment of the tail current from this predetermined amount. The output of the differential pair 632 at the collector of transistor 634 is coupled to the base of output transistor 640, whose emitter is connected to the positive supply and whose collector is connected in feedback relation to the base of transistor 636 through resistor 648. The collector of transistor 640 is also connected to a point of reference potential 218, through resistor 650. A pull-down current is supplied by transistor 656. The base of transistor 656 is connected to a source of potential at terminal 680 that allows transistors connected to it to generate a predetermined current. Resistor 658 allows the adjustment of the pull down current from this predetermined amount. A feedback stabilizing network comprising the series combination of capacitor 652 and resistor 654 is connected from the collector to the base of transistor 640.

In operation amplifier 260 has unity feedback around it, so that the voltage at the collector of transistor 640 is essentially equal to that across capacitor 618, that is to say, equal to the positive envelope of the input signal. The current through resistor 650 is therefore equal to the envelope voltage divided by the resistance of resistor 650. The collector current of transistor 640 is therefore equal to the current through resistor 650 plus the pull-down current drawn by transistor 656.

Transistor 660 mirrors the collector current of transistor 640; the collector of transistor 660 is coupled to a node 278 and to the collector of a second pull down transistor 662 whose emitter is connected to ground through resistor 664. The output from the buffer amplifier is equal to the collector current of transistor 660 (equal to that of transistor 640) less the pull-down current of transistor 662, which can be adjusted by adjusting the value of resistor 664. In operation, resistor 664 is made larger than resistor 658 in order to make the dc output of the buffer amplifier positive, i.e., of the same sign as the envelope signal. This current helps set the lower break point for the compressor. It will be recalled that the lower break point is defined as the point at which the current induced by the envelope signal is equal to the dc current. It should be noted that the lower break point is also controlled by the compressor programming current $I_{pc}$, as described above in connection with FIG. 5, by transistor 556 and resistor 558.

Because of the unique design of the variolosser of the '517 patent in which nonlinearities of the output and feedback cells cancel, nonlinear distortion of signals amplified by the variolosser in the absence of control signals is minimal. The variolosser is a signal multiplier, however, and special attention must be paid to a type of intermodulation distortion that arises as a result of the exercise of this signal multiplication function. A particularly troublesome type of distortion arises from imperfections in the variolosser that can be represented as a dc input offset voltage. This offset arises from imbalances in dc operating currents, geometrical imbalances in semiconductor device fabrication such as those of the two transistors making up the input differential pair of the variolosser amplifier, a dc offset coupled into the variolosser input from the signal source (if it is dc coupled) and the like. This dc offset acts as an input signal added to the audio signal.

The output of the variolosser is the product of two signals, i.e., the audio signal itself (including the dc offset) and the control signal, which is derived from the audio signal and is a representation of its envelope. Distortion arises in the form of the product of the audio signal with its own envelope. When the release time of the compressor is short, the envelope signal has a low frequency audio component that modulates the audio signal, resulting in low frequency components of distortion that are called difference tone intermodulation (DTIM) products. If two tones of roughly equal amplitude and closely spaced in frequency, 2700 Hz and 3000 Hz for example, are applied to the compressor input, the envelope of this composite signal will vary at a rate equal to the frequency difference, or 300 Hz. When this envelope signal is rectified and filtered to form a control signal applied to the variolosser, sum and difference tones appear at 2400 and 3300 Hz at the variolosser outputs. When speech or music signal is being processed, these products will cause "muddiness" in the sound. The amplitude of the 300 Hz component of the control signal will depend on the degree of filtering by capacitor 618 and resistor 620. When this degree of filtering is small, as when the compressor release time is short, the 300 Hz component can be sizable, but in ordinary practice, the filtering is sufficient to keep this distortion to negligible proportions.

A more serious signal degradation may take place as a result of the envelope signal multiplying the dc offset to produce a replica of the envelope signal itself at the output. This arises as the product of the envelope signal and a constant (the dc offset). Thus, in the example of the 2700 Hz and 3000 Hz tones, a 300 Hz difference tone will appear at the output. With speech or music signals, such a low frequency difference tone—the signal envelope—may be clearly audible and can be very annoying.

Another serious distortion arises as a result of the multiplication of the envelope with the dc offset because the attack time for compressors is usually made quite short compared with the release time. A sudden increase in the amplitude of the incoming signal will cause the envelope signal from the amplitude detector to exhibit a sudden rise, or a step, which has spectral components through much of the audio range. When this is multiplied by the dc offset, it appears directly at the variolosser output as a distortion signal with a broad frequency range covering much of the audio spectrum. From experience, when this effect is made negligible all other distortions arising from the multiplication of the signal plus offset by the signal envelope are also negligible. Because this distortion is associated with the attack time of the amplitude detector, we have termed it "attack distortion." With speech signals that change in amplitude in a sudden fashion, what is heard in addition to the speech is an annoying "static" or scraping sound.

This effect may be quantified by measuring the change in the dc output offset of the variolosser when a high audio level is suddenly applied to the variolosser. The dc voltage at the output of the compressor is first measured under conditions of zero input signal. Then a sinusoidal signal of a level equivalent to an 80 dBSPL signal is applied to the compressor input and the dc voltage at the output of the compressor is again measured. The dc shift in the variolosser output is indicative of the amount of attack distortion.

The amount of attack distortion varies with the amount of compression and gain that is programmed into the compressor. This arises from two separate causes. First, the amount of gain in the variolosser will obviously affect the dc output shift. Second, a more subtle effect is that the dc input offset varies with the program (the gain and compression ratio) selected as well as with the signal level applied to the variolosser. It is this second effect that makes the problem a most difficult one. The reduction of this effect by the compressor of the present invention comes about by eliminating the aforementioned change of $I_B$ with signal level. This change of $I_B$ in the prior art is replaced in the present invention by the fixed resistive path of the feedforward resistor, $R_s$.

Figure 7:
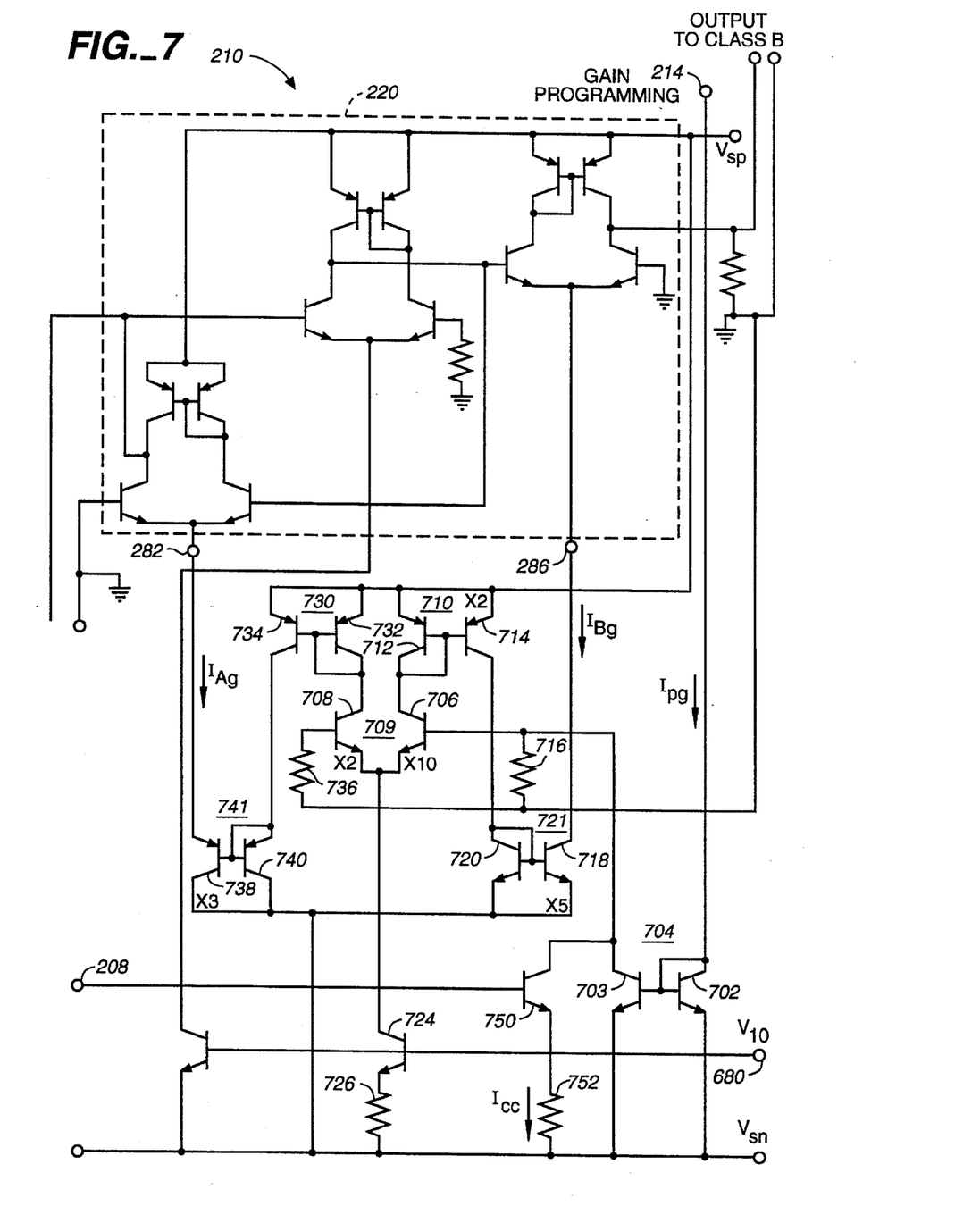
FIG. 7 is a circuit diagram of the programmable gain section of the signal processing system for each channel of the multiband compressor system in accordance with one embodiment of the invention.

In the preferred embodiment of the invention, in order to program the gain of the device a second variolosser is used, one whose gain does not vary with signal level. While the preferred embodiment employs a variolosser, it will be apparent to those skilled in the art that any programmable variable gain amplifier may be used as the gain section. A circuit schematic diagram of the programmable gain section of the signal processing system of the preferred embodiment is shown in FIG. 7. It includes a variolosser 220 similar to that described above for the compression section in FIG. 5. The control currents for variolosser 220 are generated entirely from a dc programming current applied to gain programming terminal 214 that sets the gain of the variolosser in response to programming for the individual patient, user volume control information in the form of a current from the control circuitry, and gain trimming information used in adjusting the gain in manufacture of the hearing device. Because of the multiple purposes for controlling the gain, and the fact that the manufacturing gain trim must be uniform over the entire programming range, that is to say a given programming current should represent the same gain change in dB over the entire programming range, the control circuit is designed to have a gain change in dB that is linear with programming current over substantially the entire programming and volume control range. This is accomplished through the manner in which the control currents are derived. Scaling of the dB change per microampere of control current is accomplished by scaling the resistance of a pair of control resistors, 716 and 736.

Control currents are generated from the programming currents in the following way. Tail currents $I_{Bg}$ and $I_{Ag}$ are generated by current converter transistors 718 and 738, which have their collectors connected to control terminals 286 and 282 respectively, and their emitters connected to the negative supply, or ground. Bases of transistors 718 and 738 are connected to diode-connected transistors 720 and 740, respectively, which are connected to pnp current mirrors 710 and 730, respectively. The pnp current mirrors include diode connected transistors 712 and 732, whose collector currents are delivered respectively to transistors 706 and 708 of differential pair 709. It is differential pair 709 that controls the gain of the programmable gain section. The tail current of differential pair 709 is provided by current sink transistor 724, whose base is connected to the bias source, and whose value is adjusted by emitter resistor 726. This tail current is apportioned between the transistors of differential pair 709 by application of a voltage between the bases of transistors 706 and 708. The value of this voltage is established by the gain programming current in the following way. Programming currents are applied to diode-connected transistor 702 which forms part of mirror 704. Collector current of transistor 703 mirrors the programming current, and causes a voltage drop in resistor 716, which lowers the collector current of transistor 706 relative to transistor 708. These two currents, translated through their respective sets of currents mirrors, control the tail currents of the feedback and output cells of variolosser 220. It should be obvious to one skilled in the art that the emitter area ratios of mirrors 741, 730, 721 and 710, as well as differential pair 709, can be modified to adjust the relative sizes of the feedback and output cell tail currents to secure a desired gain range for variolosser 220. In a preferred embodiment, the relative areas of the transistors are proportioned as shown in FIG. 7, in which, for example, transistors 706 and 708 are denoted as X10 and X2 transistors, respectively. Thus, transistor 706 has ten times the emitter area of a standard transistor, and transistor 708 has 2 times the area of the standard. Similarly, transistors 718 and 738 are X5 and X3 transistors, and transistor 714 is a X2 transistor. All other transistors in the chain of current mirrors are standard size transistors. In this way, with zero gain programming current (the maximum gain setting) the ratio of feedback cell tail current to output cell tail current is (3×2)/(10× 2×5)=0.060. Resistor 736 permits base bias currents of transistor 708 to flow to a source of reference potential 218.

Figure 8:
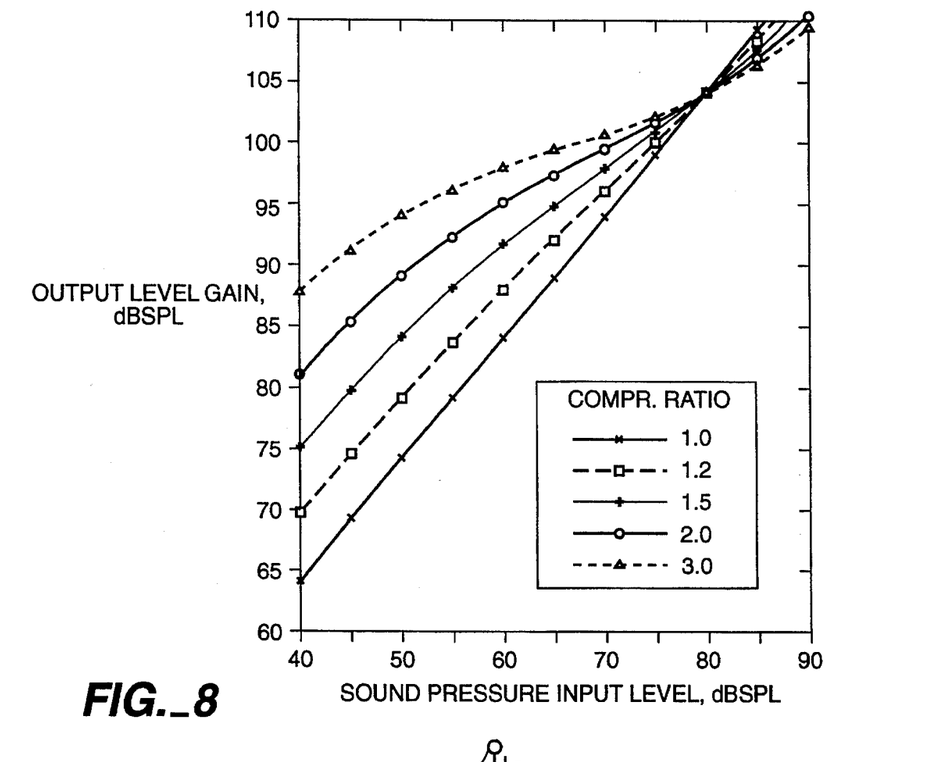
FIG. 8 is a graph of the output response of the circuit of the present invention for various programmed compression ratios as in FIG. 4, but using the circuit of FIG. 8 to make the gain of the circuit independent of compression ratio at an input sound pressure level of 80 dBSPL.

The input output curves of FIG. 4 have a range of values of about 7 dB at 80 dBSPL. In order to be able to specify the high level gain at 80 dBSPL separately from the specification of compression ratio (or, equivalently, the gain at 50 dBSPL), it is advantageous to make a gain correction for the excess gain of the programmable compressor section when it is programmed for high compression ratios. This provides orthogonal control of the compression ratio and gain. This correction is made by transistor 750, whose emitter is connected to ground through resistor 752. The base of transistor 750 is connected to the compressor programming input terminal 208. When the compressor programming current is applied, the collector current of transistor 750 increases; this current produces a voltage drop in resistor 716 which operates in an equivalent manner to the collector current of transistor 703 to reduce the gain of the variolosser by 7 dB for maximum compression. Intermediate values of compression require intermediate values of correction current, which is supplied by transistor 750. The exactitude of the correction is demonstrated by the input output curves of FIG. 8, which show the output at 80 dBSPL for all values of compression to be within one dB of each other.

Figure 9:
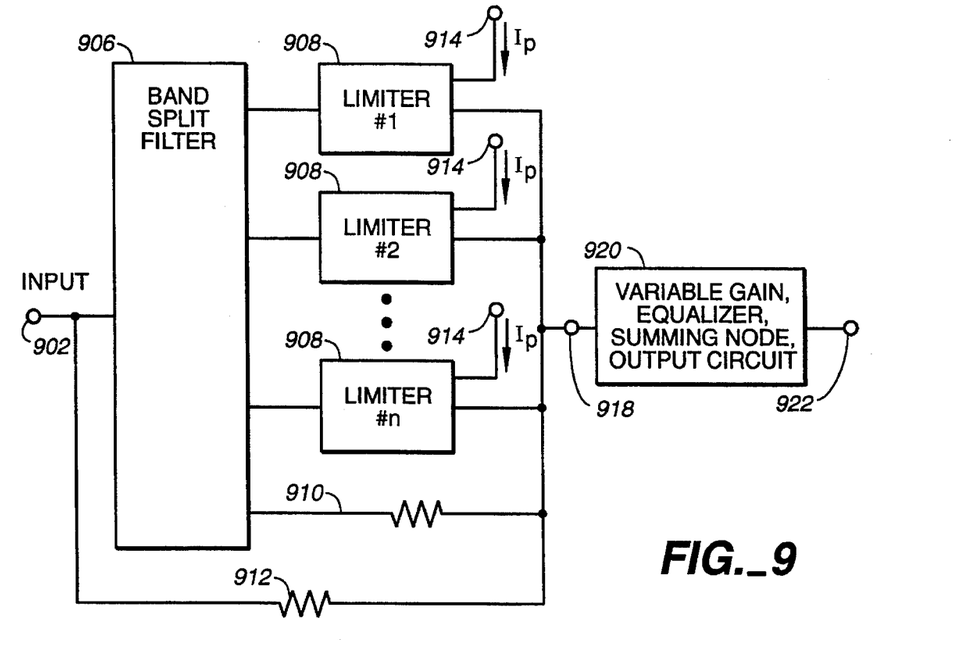
FIG. 9 is a multiband dynamic range processor using a plurality of limiters and a single side channel bypass path in another embodiment of the invention.

Another embodiment of the present invention is shown in FIG. 9, which shows a band split filter 906 having an input terminal 902, a first plurality of outputs, each connected to a limiter $908_{a,b, \ldots, n}$ of the type described above, and a second plurality of outputs, each connected through fixed gain means 910, which may be a simple resistor as shown in FIG. 9, to the summing node 918. (In FIG. 9 only one such fixed gain means 910 is shown.) In this embodiment, it is contemplated that compression is unneeded in certain frequency bands, and therefore no limiters are provided for such bands. This follows from the fact that in a large percentage of cases of sensorineural hearing impairment low frequency hearing is unaffected.

Each of the limiters 908 has an output connected to a summing node 918 and a programming terminal $914_{a,b, \ldots, n}$ for a control current to set the compression ratio as described above. A fixed conductive path is connected directly between the input terminal 902 and the summing node, 918. Summing node 918 forms the input to circuit 920 that provides amplification, volume control, programmable gain, a manufacturing gain trim, and an equalizer. This embodiment has the advantage, particularly in a system with many bands, of not requiring a separate gain variolosser for each band. It also provides for separation of the high level equalizer function from the band splitting of the compression function. The compensation for sensorineural impairment may not match the equalization requirements for that person; the embodiment of FIG. 9 allows the two requirements to be separated.

Other uses and modifications of the foregoing will be apparent to those skilled in the an without departing from the spirit of the present invention. Therefore, it is intended that the invention be limited only by the following claims.

What is claimed is:

1. A signal compressor for use in a hearing aid, comprising:

variable gain limiter means having an input terminal for receiving an electrical signal which is representative of ambient sounds and an output terminal, said limiter means having a gain which is generally a function of the amplitude of said input electrical signal, which function defines a lower breakpoint:

parallel circuit means, connected to said input terminal and said output terminal in parallel to said limiter means for providing a signal at said output terminal generally proportional to said input electrical signal which defines an upper breakpoint, such that the gain curve of said compressor defines a sigmoid function wherein there is a pivot point midway between said upper and lower break points and further wherein the compression ratio of the compressor is substantially the reciprocal of the slope of the gain curve at the pivot point; and compression control means for varying the compression ratio of the compressor by varying the slope of the gain curve at the pivot point.

2. The compressor of claim 1 wherein the control means varies the compression ratio by changing the upper and lower breakpoints of the gain curve.

3. The compressor of claim 2 wherein the pivot point remains constant as the compression ratio is varied.

* * * * *